(12) United States Patent
Takahashi et al.

(10) Patent No.: US 7,170,189 B2
(45) Date of Patent: Jan. 30, 2007

(54) SEMICONDUCTOR WAFER AND TESTING METHOD THEREFOR

(75) Inventors: Masao Takahashi, Takatsuki (JP);
Yoshirou Nakata, Souraku-gun (JP);
Tadaaki Mimura, Katano (JP);
Toshihiko Sakashita, Neyagawa (JP);
Toshiyuki Fukuda, Nagaokakyo (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 11/245,091

(22) Filed: Oct. 7, 2005

(65) Prior Publication Data

US 2006/0103408 A1    May 18, 2006

(30) Foreign Application Priority Data

Nov. 16, 2004   (JP) ............................. 2004-331293

(51) Int. Cl.
*H01L 23/544* (2006.01)
*H01L 29/10* (2006.01)

(52) U.S. Cl. ................. 257/797; 257/48; 257/E23.179; 257/E21.584; 257/E21.524; 324/765

(58) Field of Classification Search .................. 257/48, 257/678, 797, E23.179, E21.584, E21.524; 438/11–17, 401, 462; 324/765
See application file for complete search history.

(56) References Cited

U.S. PATENT DOCUMENTS

| | | | | | |
|---|---|---|---|---|---|
| 5,321,277 | A | * | 6/1994 | Sparks et al. | 257/48 |
| 6,087,719 | A | * | 7/2000 | Tsunashima | 257/686 |
| 6,133,054 | A | * | 10/2000 | Henson | 438/17 |
| 6,133,582 | A | * | 10/2000 | Osann et al. | 257/48 |
| 6,380,555 | B1 | * | 4/2002 | Hembree et al. | 257/48 |
| 6,781,150 | B2 | * | 8/2004 | Low et al. | 257/48 |
| 6,781,365 | B2 | * | 8/2004 | Hu | 324/158.1 |
| 6,881,597 | B2 | * | 4/2005 | Asayama et al. | 438/18 |
| 2002/0164840 | A1 | * | 11/2002 | Lu et al. | 438/129 |
| 2003/0122246 | A1 | * | 7/2003 | Lin et al. | 257/723 |

FOREIGN PATENT DOCUMENTS

JP    5-343487    12/1993
JP    6-45419    2/1994

* cited by examiner

*Primary Examiner*—Jasmine Clark
(74) *Attorney, Agent, or Firm*—Steptoe & Johnson LLP

(57) ABSTRACT

Circuits under electrode terminals and a nonconductor layer of the electrode terminals in semiconductor devices are prevented from being damaged during a test, such as a burn-in test, on the semiconductor devices formed on a wafer. Alignment patterns provided on the semiconductor wafer have detector electrode terminals and conductor electrode terminals. A detector electrode terminal surrounds a conductor electrode terminal separated by a gap from the detector electrode terminals and a portion of the surrounding detector electrode terminal is open.

18 Claims, 12 Drawing Sheets

SEMICONDUCTOR WAFER AND TESTING METHOD THEREFOR

FIELD OF THE INVENTION

The present invention relates to a semiconductor wafer and a testing method therefore, and in particular to a semiconductor wafer having alignment patterns for conducting tests on the semiconductor wafer and a testing method conducting tests on the semiconductor wafer.

BACKGROUND OF THE INVENTION

Electrical property tests and potential defect burn-in screening tests of semiconductor devices on a wafer have been conducted with a probe card including many probes. A number of semiconductor devices are formed on the semiconductor wafer and alignment patterns used in conducting a test of the wafer are provided on the wafer.

FIG. 25 shows an enlarged view of a portion of conventional semiconductor wafer. Shown in FIG. 25 is an alignment pattern provided for one semiconductor device.

In FIG. 25, an ion probe test on the internal circuitry of the semiconductor device 2 formed on the semiconductor wafer 1 is conducted with a probe card including a number of probes 3.

In this probe test, semiconductor devices 2 formed on the semiconductor wafer 1 are tested individually, or a number of semiconductor devices 2, for example, 2 to 16 semiconductor devices 2, are tested at a time.

A number of electrode terminals 4 are formed in each semiconductor device 2 and a pair of adjacent electrode terminals among the electrode terminals 4 is used as an alignment pattern 5. The alignment pattern 5 is used for aligning probes 3 of the probe cards with electrode terminals 4 of the semiconductor device 2.

When multiple probes 3 are brought into contact with the electrode terminals 4 in the probe test, the alignment pattern 5 is used to electrically check to determine whether the probes 3 are properly aligned with the electrode terminals 4. If they are misaligned, the alignment pattern 5 is used to re-align the probes 3 and the electrode terminals 4.

Functions of the alignment pattern 5 will be described below in detail. In the following description, a pair of electrode terminals forming the alignment pattern 5 will be identified as an electrode terminal 9 and a conductor electrode terminal 12, thereby to distinguish from other electrode terminals 4 that are not included in the alignment pattern 5.

The alignment pattern 5 comprises a first electrode terminal section 6 and a second electrode terminal section 7. The first electrode terminal section 6 includes a detector electrode terminal 8 in the form of a ring, an electrode terminal 9 connecting to the internal circuitry of the semiconductor device 2, and an interconnection 10 connecting the detector electrode terminal 8 with the electrode terminal 9.

The second electrode terminal section 7 comprises a conductor electrode terminal 12 that is connected to neither the internal circuit of the semiconductor device 2 or an external terminal. The conductor electrode terminal 12 is provided inside and separated from the detector electrode terminal 8 of the first electrode terminal section 6 by a gap 11.

The semiconductor device 2 is covered with a protective film, portions of which are removed to provide openings 13 at positions corresponding to the electrode terminals 4. The detector electrode terminal 8 of the first electrode terminal section 6 and the conductor electrode terminal 12 of the second electrode terminal section 7 are exposed in one opening 13 and the electrode terminal 9 of the first electrode terminal section 6 is exposed in another opening 13.

A method for using the alignment pattern 5 in a probe test to check to determine whether each probe 3 of a probe card is properly aligned with each electrode terminal 4 of the semiconductor device 2 will be described below.

The probes 3 of the probe card is brought into contact with the electrode terminals 4 of the semiconductor device 2. In doing so, one of two probes 3 to which different voltages are applied is brought into contact with the electrode terminal 9 in the first electrode terminal section 6 and the other with the conductor electrode terminal 12 in the second electrode terminal section 7. Then, current flowing between the probes 3 is monitored.

If both probes 3 are properly positioned with respect to the electrode terminal 9 and the conductor electrode terminal 12 and one of the probes 3 is in contact with only the conductor electrode terminal 12 without departing from the conductor electrode terminal 12, only internal output signals from the electrode terminal 9 are observed between the probes 3.

From this result of observation, it is determined that each probe 3 of the probe card is properly in contact with each electrode terminal 4 of the semiconductor device 2.

If both of the probes 3 are out of proper alignment with the electrode terminal 9 and the conductor electrode terminal 12 and one of the probe 3 is off the conductor electrode terminal 12 and is in contact with the detector electrode terminal 8 in the first electrode terminal section 6, both probes 3 are in contact with the first electrode terminal section 6 and signals other than internal output signals from the electrode terminal 9 are observed between the probes 3 in addition to internal output signals.

It is determined from this result of observation that the probes 3 of the probe card are in contact with the electrode terminals 4 of the semiconductor device 2 in an improper manner.

FIG. 26 is a schematic diagram showing another conventional alignment pattern.

The alignment pattern 5 in FIG. 26 is provided in the scribe line 15 between semiconductor devices 2 formed on a semiconductor wafer 1. The alignment pattern 5 comprises three electrode terminals 4 arranged in line and an interconnection 16 interconnecting them. The electrode terminal 4 at the center is smaller than the other electrodes at the sides. Openings 13 provided in the protective film of the semiconductors 2 have shapes in accordance with the sizes of the side electrodes 4 and the center electrode terminal 4.

A method for using the alignment pattern 5 in a probe test will be described below. The probes 3 of a prove card are brought into contact with the electrode terminals 4 of a semiconductor device 2. In doing so, one of three probes 3 is brought into contact with the electrode terminal 4 at the center and the other two probes with the electrode terminals 4 at the sides. Then, electric signals at the center electrode terminal 4 are monitored while a voltage is being applied to the electrode terminals 4 at the sides.

If the center probe 3 is not off the center electrode terminal 4 and the tree probes 3 are in contact with the side electrode terminals 4 and the center electrode terminal appropriately, electric signal from the center probe 3 can be observed.

From this result of observation, it is determined that each probe 3 of the probe card is properly in contact with each electrode terminal 4 of the semiconductor device 2.

On the other hand, if the center probe 3 is off the center electrode terminal 4, no electric signal from the center probe 3 can be observed.

It is determined from this result of observation that the probes 3 of the probe cared are out of alignment with the electrode terminals 4 of the semiconductor device 2.

Documents about the conventional art include:
1. Japanese Patent Laid-Open No. 5-343487
2. Japanese Patent Laid-Open No. 6-045419

Technologies for creating as many semiconductor devices as possible on one semiconductor wafer are becoming increasingly important because of requirements in technology trends and cost advantage. Accordingly, the size of semiconductor devices is being reduced by miniaturizing the internal circuits of semiconductor devices and reducing the distance between electrode terminals or providing circuit elements directly underneath the electrode terminals or under a location close to the electrode terminals.

This increases the possibility that when probe tips are brought into contact with the electrode terminals of the semiconductor devices on a wafer during an electrical property test or a burn-in test, the probe tips contact the semiconductor devices in locations off the electrode terminals.

An electrode terminal is exposed in an opening in a nonconductor layer that covers the semiconductor device. If the tip of a probe is out of proper alignment with the electrode terminal, the probe can damage the nonconductor layer around the opening or the load concentrating on the tip of the probe can damage a circuit element under the electrode terminal.

Using a probe card to conduct an electrical property test or a burn-in test of semiconductor deices on a wafer has the following problems.

One problem is that plastic deformation of probes of a probe card can occur when they contact electrode terminals. Another problem is that because the area of an electrode terminal is well larger than the area of contact between the electrode terminal and the probe tip, the probe tip can slide on the electrode terminal under pressure applied on the probe during the contact and thus the probe tip cannot accurately be aligned with the center of the electrode terminal.

As a result, the point of contact of the probe tip on the electrode terminal is gradually displaced from the center of the electrode terminal as the test progresses. Eventually, the probe tip moves off the electrode terminal exposed in the opening in a protective film, that is, the probe tip contacts the protective film around the opening. This can damage the protective film or, in worse cases, affect electrical properties of the device.

Nowadays, such defects in appearance or reliability can be detected and removed only by visual inspections under a microscope which require a large number of man-hours or a costly visual inspection machine.

Another problem is that defects undetectable by visual inspections, such as defects that are caused by minute imperfections in a nonconductor layer under an electrode terminal and affect electrical properties can remain at an electrical property testing stage and man-hours for removing the defects is required.

In current tests using a probe card with many probes, when a probe contacts an electrode terminal, a considerably large load concentrates on the thin tip of the probe. For example, a load of 5 g applied to the probe tip having a diameter of 20 μm is equivalent to a pressure of 1600 kg/cm$^2$.

Therefore, if a circuit element is formed in a nonconductor layer directly underneath an electrode terminal or under a location close to an electrode terminal of a semiconductor device, damage or minute imperfections can be caused in the circuit element as well as the nonconductor layer, resulting in degradation of electrical properties of the semiconductor device. Consequently, the yields are reduced and reduction in the manufacturing costs becomes difficult.

Moreover, if atmosphere temperature is kept high while a probe is in contact with an electrode terminal in a burn-in test on a wafer, the probe, typically made of a tungsten-based material, and the electrode terminal can be oxidized at the point of contact. Consequently, the electric resistance would increase and stable testing would be prohibited.

To prevent such oxidization of contact points, burn-in tests have been performed in an inert atmosphere. This poses the problem of increasing manufacturing costs since a large amount of inert gas is used.

An object of the present invention is to improve the efficiency of tests on high-density semiconductor devices having circuit elements directly underneath electrode terminals or under a location close to electrode terminals, that is, electrical property tests and potential defect burn-in screenings of devices on a wafer. In particular, an object of the present invention is to provide a semiconductor wafer that has alignment patterns to allow bump electrodes and corresponding electrode terminals of semiconductor devices to contact with each other without misalignment in a test using a contactor having multiple bump electrodes, and a testing method therefor.

DISCLOSURE OF THE INVENTION

In order to solve the problems, the present invention provides a semiconductor wafer on which a plurality of semiconductor devices and alignment patterns are formed, wherein the alignment patterns are formed by an underlying insulating layer, a conducting layer, and upper insulating layer formed on the wafer, a detector electrode terminal and a conductor electrode terminal are formed in the conducting layer, the detector electrode terminal and the conductor electrode terminal are electrically interconnected through a conductor, the upper insulating layer has a detector opening and a conductor opening, the conductor electrode terminal is exposed in the conductor opening, the detector electrode terminal is partially exposed in the detector opening along the inside perimeter of the detector opening, and the underlying layer is exposed in the detector opening in the region other than the region of the detector electrode terminal.

In the semiconductor wafer according to the present invention, a through-hole in which the underlying insulating layer is exposed is formed in the detector electrode terminal, the detector opening is formed around the through-hole, and the detector electrode terminal is exposed in the shape of ring along the inside perimeter of the detector opening.

In the semiconductor wafer according to the present invention, the through-hole is provided at plurality of locations in the detector electrode terminal in line at regular spacings, the through-holes proportionally varying in size.

In the semiconductor wafer according to the present invention, the detector opening is rectangular and a portion of the detector electrode terminal is exposed along one side of the inside perimeter of the detector opening.

The present invention also provides a semiconductor wafer on which a plurality of semiconductor devices and alignment patterns are formed, wherein the alignment patterns are formed by an underlying insulating layer, a conducting layer, and an upper insulating layer formed on the wafer, a plurality of detector electrode terminals and a plurality of conductor electrode terminals are formed on the conducting layer, the detector electrode terminal and the conductor electrode terminal that make a set are electrically interconnected through a conductor, the upper insulating layer has one detector opening in which the plurality of detector electrode terminals are exposed and a plurality of conductor openings, in each of which one of the plurality of conductor electrode terminals is exposed, the detector opening is rectangular, each of the plurality of detector electrode terminal is partially exposed in the detector opening along each of the sides of the inside perimeter of the detector opening, and the underlying insulating layer is exposed in the detector opening in the region other than the region of the detector electrode terminal.

The present invention also provides a semiconductor wafer on which a plurality of semiconductor devices and alignment patterns are formed, wherein the alignment patterns are formed by an underlying insulating layer, a conducting layer, and an upper insulating layer, a plurality of detector electrode terminals and a plurality of conductor electrode terminals are formed on the conducting layer, the detector electrode terminal and the conductor electrode terminal making a set are electrically interconnected through a conductor, the upper insulating layer has one detector opening in which the plurality of detector electrode terminals are exposed and a plurality of conductor openings, in each of which one of the plurality of conductor electrode terminals is exposed, the plurality of detector electrode terminals are exposed in the form of spaced coaxial rings in the detector opening, and the underlying insulating layer is exposed in the detector opening in the region other than the region of the detector electrode terminal.

In the semiconductor wafer of the present invention, the conductor electrically connecting the detector electrode terminal and the conductor electrode terminal is the conducting layer.

In the semiconductor wafer of the present invention, a contact hole is formed in the underlying insulating layer of the alignment patterns, an interconnection is provided in the contact hole, and the conductor electrically interconnecting the detector electrode terminal and the conductor electrode terminal is the interconnection.

The present invention also provides a semiconductor wafer on which a plurality of semiconductor devices and alignment patterns are formed, wherein the alignment patterns are formed by an underlying insulating layer, a conducting layer, and upper insulating layer formed on the wafer, a detector electrode terminal and a conductor electrode terminal are formed in the conducting layer, one of the detector electrode terminal and the conductor electrode terminal is connected to grounding conductor, the other electrode terminal is connected to an input circuit conductor or in a floating state, the upper insulating layer has an opening in which the conductor electrode terminal is exposed and the detector electrode terminal is partially exposed along the inside perimeter of the opening, and the underlying layer is exposed in the opening in the region other than the regions of the conductor electrode terminal and the detector electrode terminal.

The present invention also provides a semiconductor wafer testing method for conducting a burn-in test or an electrical property test on a semiconductor wafer having a plurality of semiconductor devices and alignment patterns formed thereon by using a contactor including a plurality of bump electrodes, wherein information about misalignment between electrode terminals of alignment patterns provided at least two locations on the semiconductor wafer and alignment bump electrodes provided in the conductor is electrically detected and monitored during alignment for bringing electrode terminals of the semiconductor devices and the alignment pattern in contact with bump electrodes of the contactor.

According to the present invention, alignment patterns are used when a burn-in test or an electrical property test is conducted on a semiconductor wafer on which semiconductor devices with a highly advanced structure are formed and thereby electrode terminals on the semiconductor wafer can be brought into contact with bump electrodes of a contactor while they are kept in accurate alignment with each other. Thus, concentration of a load on the electrode terminals can be avoided and therefore high-quality, high-efficiency, and low-cost testing can be accomplished.

DESCRIPTION OF THE EMBODIMENTS

Embodiments of the present invention will be described below with reference to the accompanying drawings.

First Embodiment

Figure 1A:
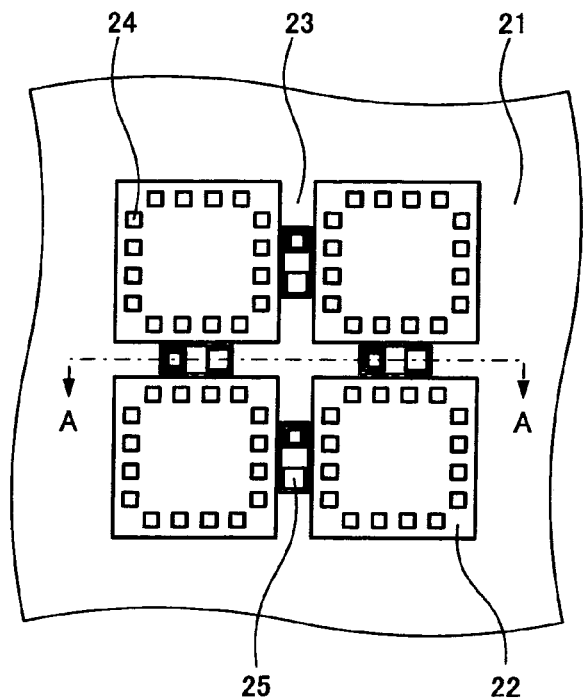
FIG. 1A is a plan view of a semiconductor wafer according to a first embodiment of the present invention.
Figure 1B:
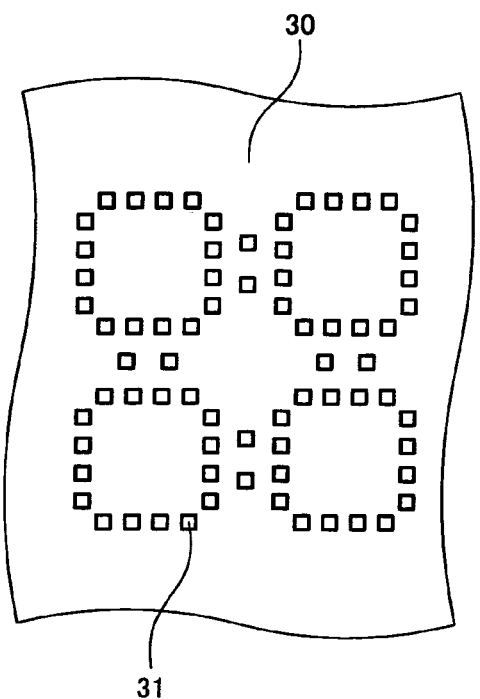
FIG. 1B is a plan view of contactors for testing the semiconductor wafer.

FIG. 1A is a plan view of a semiconductor wafer according to a first embodiment of the present invention; FIG. 1B is a plan view of a contactor for testing semiconductor devices on the wafer.

The semiconductor wafer 21 in FIG. 1A includes a number of semiconductor devices 22, scribe lines 23 for scribes formed between the semiconductors 22, and alignment patterns 25 formed inside the scribe lines 23. Electrode terminals 24 for connecting to the external are formed on each semiconductor device 22.

The alignment pattern 25 is used in a burn-in test or an electrical property test on the semiconductor wafer 21. In the first embodiment, more than one alignment pattern 25 is formed in each of the scribe lines 23 intersecting at right angles.

The contactor 30 in FIG. 1B is a testing tool for conducting burn-in tests or electrical property tests on the semiconductor wafer 21. The contactor 30 has on a substrate a number of bump electrodes 31 for testing some or all of the semiconductor devices 22 at a time. During a test, the contactor 30 is opposed to the semiconductor wafer 21 and the bump electrodes 31 are connected to the electrode terminals 24 and alignment patterns 25 of each semiconductor device 22.

When the contactor 30 is used to test each semiconductor device 2 on the semiconductor wafer 1, one must make sure that the bump electrodes 31 of the contactor 30 are in contact with and in proper alignment with the electrode terminals 24 of the semiconductor devices 22.

While the contactor 30 in FIG. 1 is of rectangular shape, it may be of circular or polygonal shape.

Figure 2:
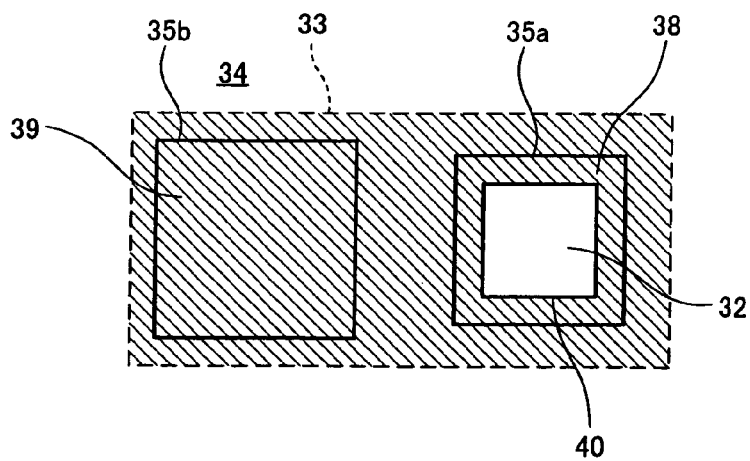
FIG. 2 is a plan view of an alignment pattern according to the first embodiment.
Figure 3:
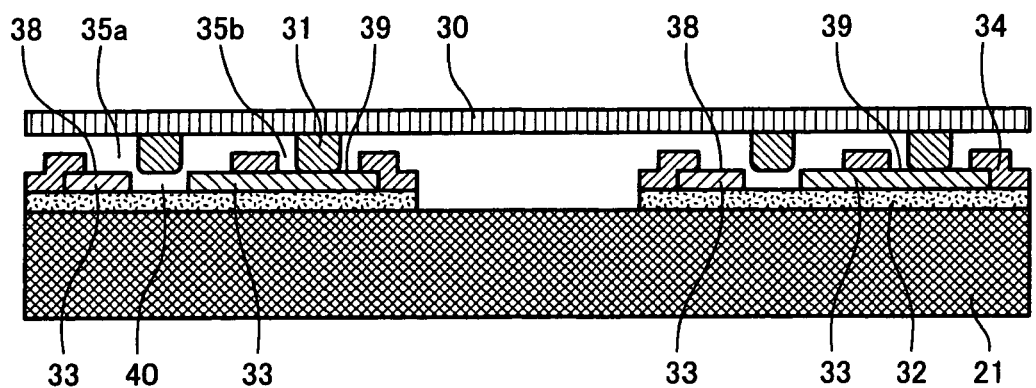
FIG. 3 is a cross-sectional view in the direction of arrow A—A of FIG. 1A, showing a semiconductor wafer in proper contact with contactors in the first embodiment.
Figure 4:
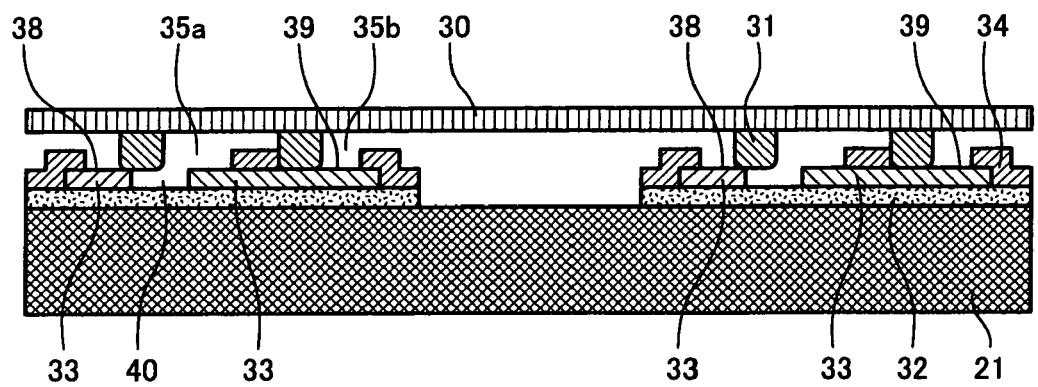
FIG. 4 is a cross-sectional view in the direction of arrow A—A of FIG. 1A showing a semiconductor wafer misaligned with and in contact with contactors in the first embodiment.

FIG. 2 is a plan view of an alignment pattern 25. FIGS. 3 and 4 are cross-sectional views in the direction of arrow A—A of FIG. 1, showing the semiconductor wafer 21 in contact with the contactor 30. FIG. 3 shows the state in which the alignment patterns 25 on the semiconductor wafer 21 are in contact and in proper alignment with the bump electrodes 31 of the contactor 30. FIG. 4 shows a case where the alignment patterns 25 on the semiconductor wafer 21 is in contact but out of alignment with the bump electrodes 31 of the contactor 30.

In the semiconductor wafer 21 in FIGS. 2 to 4, a conducting layer 33 is formed on an underlying insulating layer 32, and an upper insulating layer 34 is formed on the conducting layer 33.

Each alignment pattern 25 has a detector electrode terminal 38 and a conductor electrode terminal 39 formed by the conducting layer 33 on the underlying insulating layer 32. The detector electrode terminal 38 and the conductor electrode terminal 39 are contiguous regions formed in the conducting layer 33. The conducting layer 33 itself functions as a conductor electrically interconnecting the detector electrode terminal 38 and the conductor electrode terminal 39. A through-hole 40 is provided in the region of the detector electrode terminal 38 in the conducting layer 33.

The upper insulating layer 34 is formed over the underlying insulating layer 32 and the conducting layer 33. A rectangular detector opening 35a and a rectangular conductor opening 35b are provided in the upper insulating layer 34.

In the detector opening 35a, the detector electrode terminal 38 is partially exposed in the form of a ring along the inside perimeter of the detector opening 35a. A through-hole 40 is provided in the center of the detector opening 35a and the underlying insulating layer 32 is exposed in the through-hole 40 where the conducting layer 33 does not exist. In the conductor opening 35b, the conductor electrode terminal 39 is exposed in rectangular shape.

As shown in FIG. 3, when the semiconductor wafer 21 is in proper alignment with the contactor 30, the bump electrode 31 corresponding to the detector opening 35a is positioned in the center of the detector opening 35a, is opposed to the through-hole 40, where the detector electrode terminal 38 does not exist, and is out of contact with the conducting layer 33 in the region of the detector electrode terminal 38. The bump electrode 31 corresponding to the conductor opening 35b is in contact with the conducting layer 33 in the region of the conductor electrode terminal 39.

In this state, no current is being conducted between the two bump electrodes 31. Therefore, if it is detected that the two bump electrodes 31 are out of conduction with a tester connected to the contactor 30, it can be determined that the contactor 30 is in proper contact with the semiconductor wafer 21. For example, a voltage can be applied across the electrodes 31 and the value of electric current conducted can be detected under the voltage to determine whether the semiconductor wafer 21 and the contactor 30 are in proper alignment with each other.

If the semiconductor wafer 21 and the contactor 30 are misaligned with each other and are positioned improperly with respect to each other as shown in FIG. 4, the bump electrode 31 corresponding to the detector opening 35a is not in the center of the detector opening 35a, faces to the through-hole 40, is out of the center of the through-hole 40, and in contact with the conducting layer 33 in the region of the detector electrode terminal 38. The bump electrode 31 corresponding to the conductor opening 35b is in contact with the conducting layer 33 in the region of the conductor electrode terminal 39.

In this state, electricity flows between the bump electrode 31 in contact with the detector electrode terminal 38 in the detector opening 35a and the bump electrode 31 in contact with the conductor electrode terminal 39 in the conductor opening 35b through the conducting layer 33.

Therefore, if it is detected with a tester connected to the contactor 30 that electricity is flowing between the two bump electrodes 31, it can be determined that the semiconductor wafer 21 and the contactor 30 are out of alignment with each other and are positioned improperly with respect to each other.

By electrically monitoring and detecting in this way at a number of alignment patterns 25 provided on a semiconductor wafer 21 whether or not the semiconductor wafer 21 is in proper alignment with a contactor 30, information can be obtained such as the direction of misalignment, if any, of the semiconductor wafer 21 with the contactor 30, the magnitude of misalignment, and a relative tilt angle between the semiconductor wafer 21 and the contactor 30.

For example, because more than one alignment pattern 25 is provided in each of the scribe lines 23 intersecting at right angles in the present embodiment, it can be determined that the semiconductor wafer 21 and the contactor 30 are misaligned with each other about the axis perpendicular to the semiconductor wafer 21 if proper alignment is detected at one alignment pattern 25 and misalignment is detected at another alignment pattern 25.

By using this monitoring method before testing semiconductor devices on a wafer by using a contactor 30 having bump electrodes 31, the test can be performed with the bump electrodes 31 in alignment and contact with the electrode terminals 24 of the semiconductor devices 22.

Figure 5:
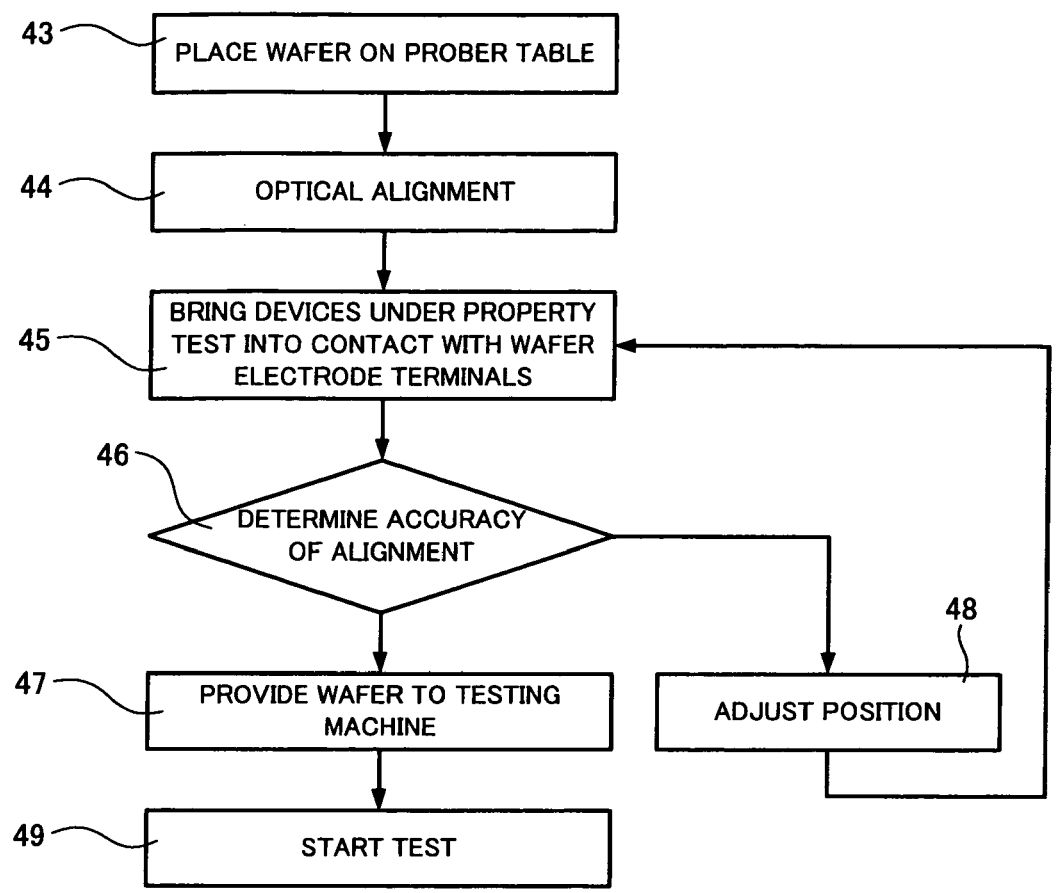
FIG. 5 is a flowchart of a process until a test using a monitoring method is completed in an inspection of a wafer according to the first embodiment.

FIG. 5 is a flowchart of a testing process according to the first embodiment of the present invention. The method for testing semiconductor devise 22 on a wafer involves placing the semiconductor wafer 21 under test on a prober table (step 43), optically aligning the semiconductor wafer 21 with a contactor 30 (step 44), brining the bump electrodes 31 of the contactor 30 into alignment and contact with electrode terminals 24 on the semiconductor wafer 21 (step 45), checking the accuracy of alignment between the bump electrodes 31 and the electrode terminals 24 to determine whether the accuracy is acceptable or not (step 46), placing the semiconductor wafer 21 and the contactor 30 in a testing machine (step 47), adjusting the relative locations of the semiconductor devices 22 and the contactor 30 (step 48), and starting an electrical property test on the semiconductor devices 22 (step 49).

The position adjustment step 48 is performed if it is determined at the alignment accuracy determining step 46 that the accuracy of alignment is unacceptable. In the position adjustment, the electrode terminals 24 are realigned with the bump electrodes 31 so that they are placed in proper relative positions. The re-alignment operation uses electric signals that are obtained according to the manner in which the alignment patterns and the contactor 30 are connected with each other as information used for re-alignment. Through this position adjustment, accurate alignment between the electrode terminals 24 and the bump electrodes 31 can be accomplished.

After the completion of position adjustment 48, the process returns to the alignment step 45 for brining the alignment patterns 25 into contact with the contactor 30. Once it is determined that at the alignment accuracy determining step 46 that the accuracy of alignment is acceptable, the process proceeds to step 47, where the wafer is placed into the testing machine, and then to the test starting step 49.

Second Embodiment

Figure 6:
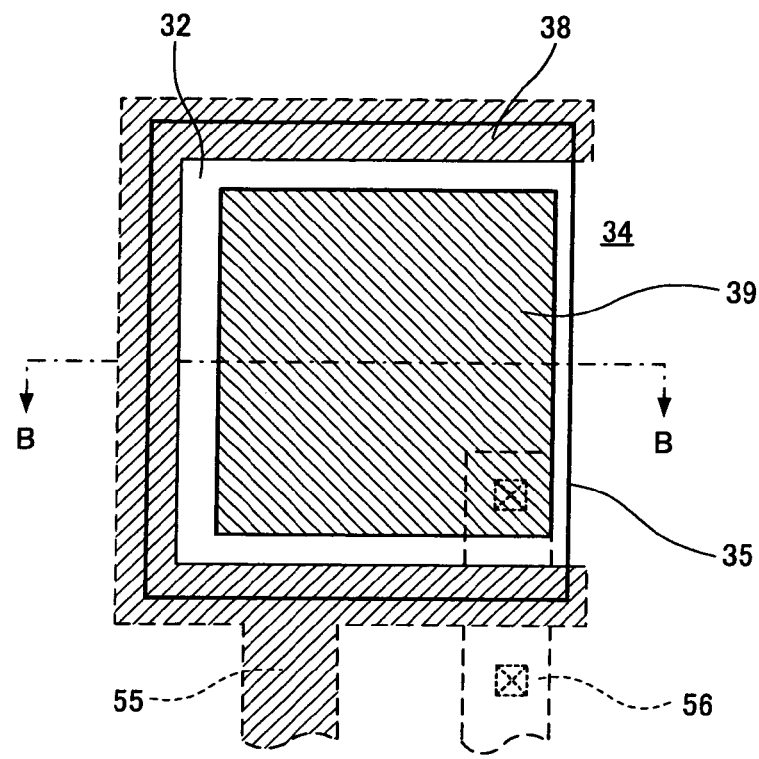
FIG. 6 is a plan view of an alignment pattern according to a second embodiment of the present invention.

A second embodiment of the present invention will be described below. FIG. 6 is a plan view of an alignment pattern 25 and FIG. 7 is a cross-sectional view in direction of arrow B—B of FIG. 6.

Figure 7:
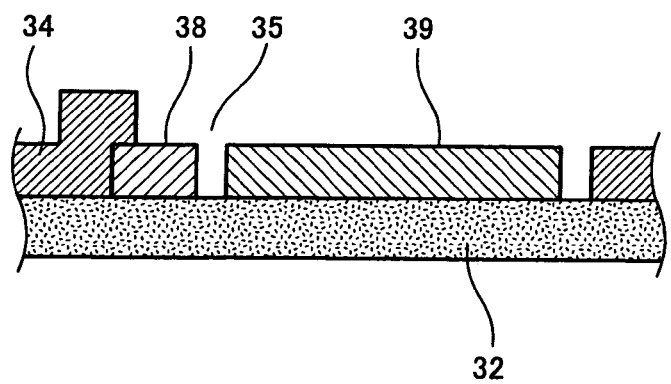
FIG. 7 is a cross-sectional view in the direction of arrow B—B of FIG. 6.

The alignment pattern 25 in FIGS. 6 and 7 includes a rectangular conductor electrode terminal 39 formed by a conducting layer on an underlying insulating layer 32, and a detector electrode terminal 38 surrounding the conductor electrode terminal 39, except along one side of the conductor electrode terminal 39. A gap is provided between the conductor electrode terminal 39 and the detector electrode terminal 38. The gap may be filled with an insulator film such as SiN.

An upper insulating layer 34 formed over the underlying insulating layer 32 and the conducting layer 33 has a rectangular opening 35 above the detector electrode terminal 38 and the conductor electrode terminal 39. The entire conductor electrode terminal 39 is exposed in the opening 35 and the detector electrode terminal 38 is partially exposed along the internal perimeter of the opening 35. The underlying insulting layer 32 is also exposed in the regions where neither the conductor electrode terminal 39 nor the detector electrode terminal 38 is provided.

The detector electrode terminal 38 is connected to a grounding conductor 55 and the conductor electrode terminal 39 is connected to an input circuit conductor 56. With this configuration, misalignment between the semiconductor wafer 21 and a contactor 30 is electrically detected during the alignment and a voltage is applied to an internal circuit, which will be described later. The conductor electrode terminal 39 may be in a floating state. Alternatively, the conductor electrode terminal 39 may be connected to the grounding conductor 55, and the detector electrode terminal 38 may be connected to the input circuit conductor 56.

In the second embodiment, the conductor electrode terminal 39 may be an electrode terminal 24 of a semiconductor device 22, or the conductor electrode terminal 39 may be provided separately. While the conductor terminal 39 is of a rectangular shape, the shape of the conductor terminal 39 is not limited to a rectangle. Furthermore, the upper insulating layer 34 may be extended to the position at which it contacts one end of the conductor electrode terminal 39 at the open side of the detector electrode terminal 38. This reduces depressions in the surface of the alignment pattern 5.

Figure 8:
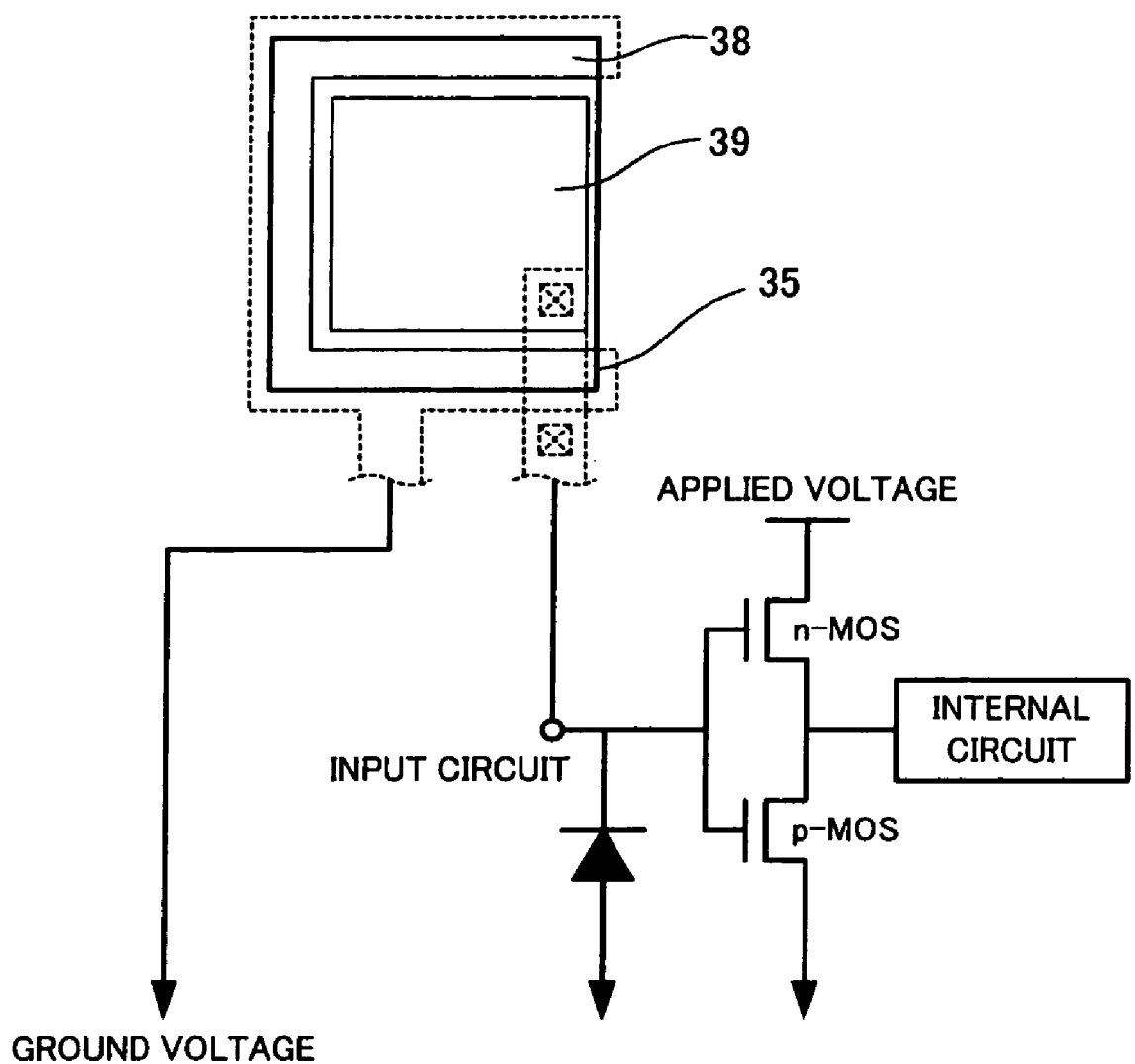
FIG. 8 is a schematic diagram of a circuit for electrically detecting an alignment in the second embodiment.

FIG. 8 is a schematic diagram showing an example of a circuit for electrically detecting alignment between the semiconductor wafer 21 and the contactor 30.

During a test, a pair of bump electrodes 31 provided on the contactor 30 and electrically connected with each other are placed in the opening 35. In this state, if both of the bump electrodes 31 is in contact with the conductor electrode terminal 39, the ground conductor 55 and the input circuit conductor 56 remains out of conduction with each other. Therefore, if no input into the internal circuit is detected, it is determined that the semiconductor wafer 21 and the contactor 30 is in proper alignment with each other.

On the other hand, if one of the bump electrodes 31 is in contact with the detector electrode terminal 38 and the other bump electrode 31 is in contact with the conductor electrode terminal 39, electricity flows between the grounding conductor 55 and the input circuit conductor 56 through one of the two bump electrodes 31. Accordingly, an input into the internal circuit is detected and thereby it is determined that the semiconductor wafer 21 and the contactor 30 are out of alignment.

Third Embodiment

Figure 9:
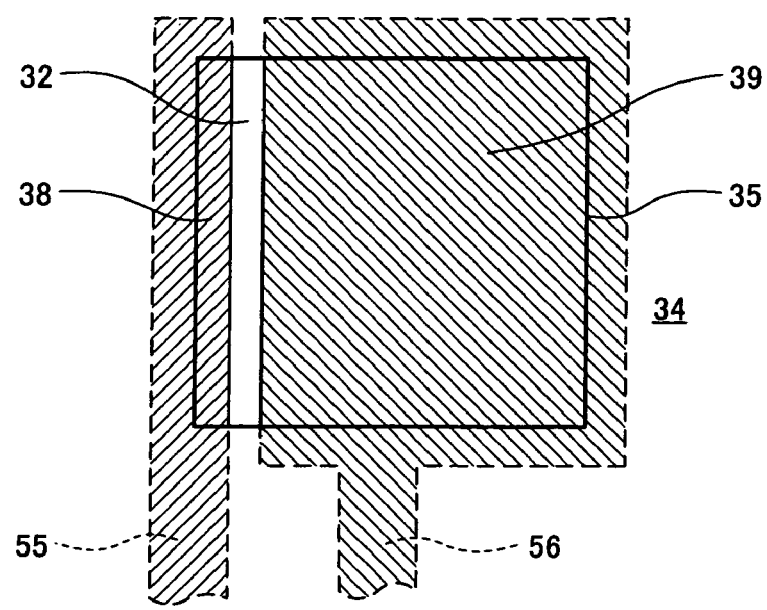
FIG. 9 is a plan view of an alignment pattern according to a third embodiment of the present invention.

A third embodiment of the present invention will be described below. FIG. 9 is a plan view of an alignment pattern 25. The alignment pattern 25 in FIG. 9 includes a rectangular conductor electrode terminal 39 formed by a conducting layer on an underlying insulating layer 32, and a detector electrode terminal 38 opposed to and separated by a gap from one end of he conductor electrode terminal 39.

An upper insulating layer 34 provided over the underlying insulating layer 32 and the conducing layer 33 has an opening 35 above the detector electrode terminal 38 and the conductor electrode terminal 39. In the opening 35, a portion of the conductor electrode terminal 39 and a portion of the detector electrode terminal 38 are exposed from one of the sides of the perimeter of the opening 35, the portion of the detector electrode terminal 38 is exposed along one of the sides of the perimeter of the opening 35, and the underlying insulating layer 32 is exposed in the regions where neither the conductor electrode terminal 39 nor the detector electrode terminal 38 is provided. The exposed area of the conductor electrode terminal 39 is well larger than the exposed area of the detector electrode terminal 38.

As with the second embodiment, the detector electrode terminal 38 is connected to a grounding conductor 55 and the conductor electrode terminal 39 is connected to an input circuit conductor 56. Misalignment between the semiconductor wafer 21 and a contactor 30 is electrically detected by applying a voltage to an internal circuit during an alignment step. The conductor electrode terminal 39 may be in a floating state.

In actual alignment, a pair of alignment patterns 25 having different layouts are used. For example, in one of the two alignment patterns 25, the conductor electrode terminal 39 maybe disposed in its right-hand part and the detector electrode terminal 38 in its left-hand part. In the other alignment pattern 25, the conductor electrode terminal 39 maybe disposed in its left-hand part and the detector electrode terminal 38 in the right-hand part.

Determination as to whether or not the semiconductor wafer 21 is in proper alignment with the contactor 30 is made in the same manner as the second embodiment.

Fourth Embodiment

Figure 10:
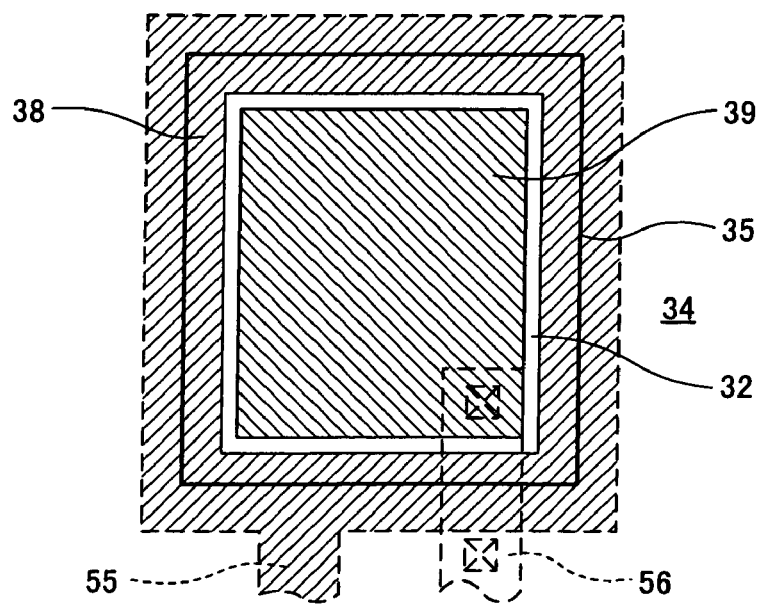
FIG. 10 is a plan view of an alignment pattern according to a fourth embodiment of the present invention.

A fourth embodiment of the present invention will be described below. FIG. 10 is a plan view oft he alignment pattern 25.

The alignment pattern 25 in FIG. 10 includes a rectangular conductor electrode terminal 39 formed by a conducting layer on an underlying insulting layer 32 and a detector electrode terminal 38 which surrounds the conductor electrode terminal 39 with its sides opposed to the sides of the conductor electrode terminal 39 and is separated from the conductor electrode terminal 39 by a gap.

An upper insulating layer 34 formed over the underlying insulating layer 32 and the conducting layer 33 has an opening 35 above the detector electrode terminal 38 and the conductor electrode terminal 39. In the opening 35, the entire conductor electrode terminal 39 is exposed, the detector electrode terminal 38 is partially exposed in the form of a ring along the inside perimeter of the opening 35, and the underlying insulating layer 32 is exposed in the regions where the conductor electrode terminal 39 or the detector electrode terminal 38 is not provided.

As with the second embodiment, the detector electrode terminal 38 is connected to a grounding conductor 55 and the conductor electrode terminal 39 is connected to an input circuit conductor 56. The conductor electrode terminal 39 can be in a floating state.

Determination as to whether the semiconductor wafer 21 is in proper alignment with a contactor 30 is made in the same manner as the second embodiment.

Fifth Embodiment

Figure 11:
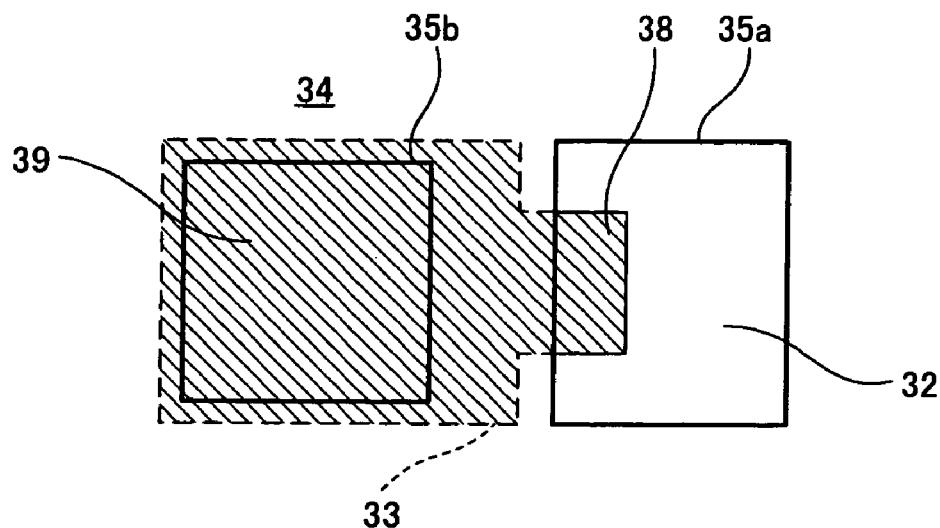
FIG. 11 is a plan view of an alignment pattern according to a fifth embodiment of the present invention.

A fifth embodiment of the present invention will be described below. FIG. 11 is a plan view of an alignment pattern 25.

The alignment pattern 25 in FIG. 11 includes a detector electrode terminal 38 and a conductor electrode terminal 39 formed on an underlying insulating layer 32. The detector electrode terminal 38 and the conductor electrode terminal 39 are formed as a continuous conducting layer 33. The conducting layer 33 itself functions as a conductor electrically interconnecting the detector electrode terminal 38 with the conductor electrode terminal 39.

An upper insulating layer 34 provided over underlying insulating layer 32 and the conducting layer 33 has a rectangular detector opening 35a and a rectangular conductor opening and 35b.

In the detector opening 35a, the detector electrode terminal 38 of the conducting layer 33 is partially exposed at only one of the sides of the opening 35a and the underlying insulating layer 32 is exposed in the remaining regions except in the region where the detector electrode terminal 38 is formed. In the conductor opening 35b, a rectangular region of the conductor electrode terminal 39 of the conducting layer 33 is exposed.

Determination as to whether the semiconductor wafer 21 is in proper alignment with a contactor 30 is made in the same manner as the first embodiment.

Sixth Embodiment

Figure 12:
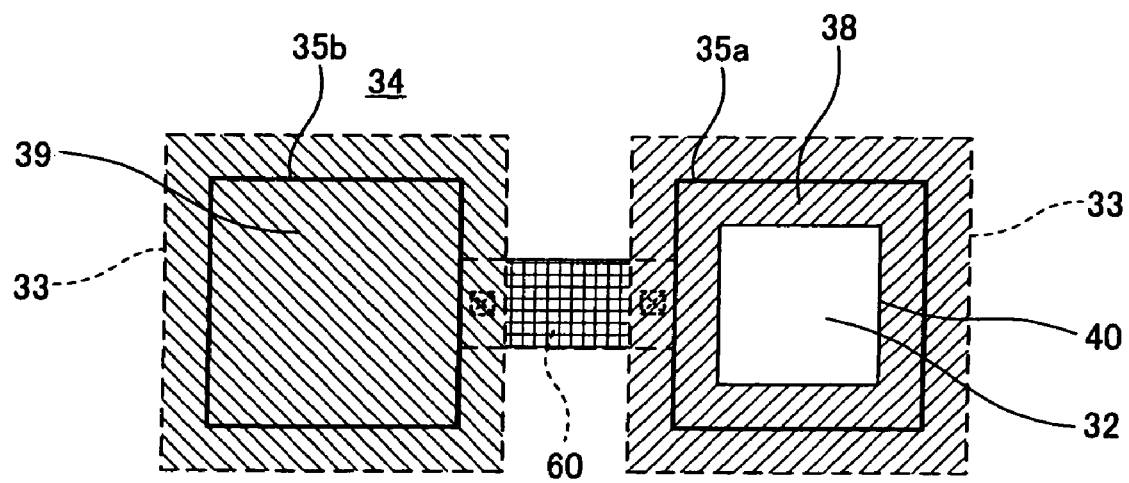
FIG. 12 is a plan view of an alignment pattern according to a sixth embodiment of the present invention.

A sixth embodiment of the present invention will be described below. FIG. 12 is a plan view of an alignment pattern 25. The alignment pattern 25 in FIG. 12 includes a detector electrode terminal 38 and a conductor electrode terminal 39 formed on an underlying insulating layer 32. The detector electrode terminal 38 and the conductor electrode terminal 39 are separately formed in discontiguous regions in a conducting layer 33.

An underlying layer interconnection 60 is provided in a contact hole in the underlying insulating layer 32, and the detector electrode terminal 38 and the conductor electrode terminal 39 are interconnected through the underlying-layer interconnection 60 which forms a conductor.

An upper insulating layer 34 provided over the underlying insulating layer 32 and the conducting layer 33 has a rectangular detector opening 35a and a rectangular conductor opening 35b.

In the detector opening 35a, the detector electrode terminal 38 is partially exposed in the form of a ring along the inside perimeter of the detector opening 35a. A through-hole 40 is provided in the center of the detector opening 35a and the underlying insulating layer 32 is exposed through the through-hole 40 in which the conducting layer 33 does not exist. In the conductor opening 35b, the conductor electrode terminal 39 is exposed in rectangular shape.

Determination as to whether the semiconductor wafer 21 is in proper alignment with a contactor 30 is made in the same manner as the first embodiment.

Seventh Embodiment

Figure 13:
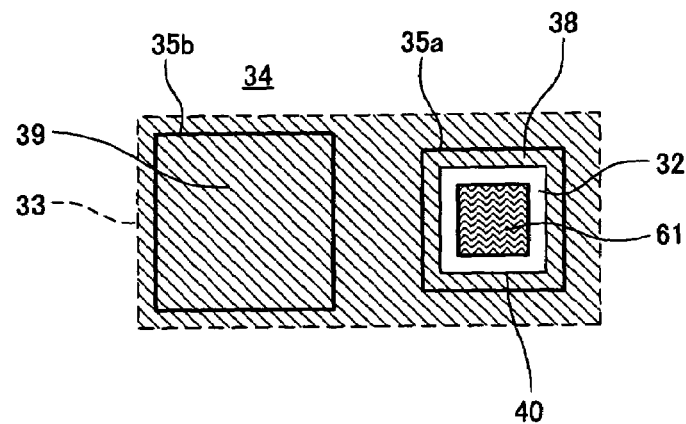
FIG. 13 is a plan view of an alignment pattern according to a seventh embodiment of the present invention.

A seventh embodiment of the present invention will be described below. FIG. 13 is a plan view of an alignment pattern 25. The alignment pattern 25 in FIG. 13 includes a detector electrode terminal 38 and a conductor electrode terminal 39 formed on an underlying insulating layer 32. The detector electrode terminal 38 and the conductor electrode terminal 39 are separate regions formed in a continuous conducting layer 33. The conducting layer 33 itself functions as a conductor electrically interconnecting the detector electrode terminal 38 and the conductor electrode terminal 39. A through-hole 40 is provided in the region of the detector electrode terminal 38 in the conducting layer 33.

An upper insulating layer 34 provided over the underlying insulating layer 32 and the conducting layer 33 has rectangular detector and conductor openings 35a and 35b.

In the detector opening 35a, the detector electrode terminal 38 is partially exposed in the form of a ring along the inside perimeter of the detector opening 35. Also in the detector opening 35a, the underlying insulating layer 32 is exposed through a through-hole 40 in which the conducting layer 33 does not exist. In the conductor opening 35b, the conductor electrode terminal 39 is exposed in rectangular shape.

A protrusion 61 is provided in the center of the detector opening 35a. The protrusion 61 is spaced apart from the detector electrode terminal 38. The protrusion 61 maybe formed of the upper insulating layer 34, the conducting layer 33 or another material. The height of the protrusion 61 is the same as that of the conducting layer 33 so that the protrusion 61 can be brought into good contact with a bump electrode 31 of a contactor 30.

Determination as to whether the semiconductor wafer 21 is in proper alignment with the contactor 30 is made in the same manner that in the first embodiment.

Eighth Embodiment

Figure 14:
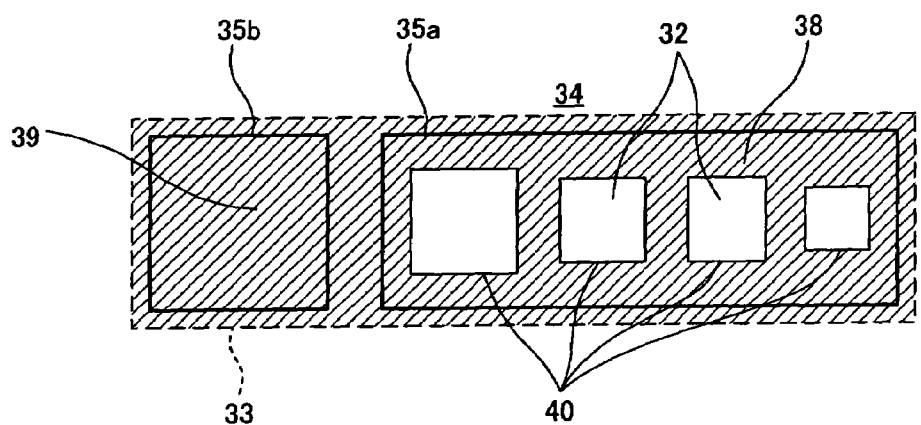
FIG. 14 is a plan view of an alignment pattern according to an eighth embodiment of the present invention.

An eighth embodiment of the present invention will be described below. FIG. 14 is a plan view of an alignment pattern 25. The alignment pattern 25 in FIG. 14 includes a detector electrode terminal 38 and a conductor electrode terminal 39 formed on an underlying insulating layer 32. The detector electrode terminal 38 and the conductor electrode terminal 39 are separate regions formed in a continuous conducting layer 33. The conducting layer 33 itself functions as a conductor interconnecting the detector electrode terminal 38 and the conductor electrode terminal 39.

A number of through holes 40 are provided in the conducting layer 33 in the region of the detector electrode terminal 38. The through-holes 40 are rectangular and proportionally vary in size. The center of each through-hole 40 is substantially aligned with the center line of the opening 35.

An upper insulating layer 34 provided over the underlying insulting layer 32 and the conducting layer 33 has rectangular detector and conductor openings 35a and 35b.

In the detector opening 35a, the detector electrode terminal 38 is partially exposed in the form of a ring along the inside perimeter of the detector opening 35a. Also in the detector opening 35a, the underlying insulating layer 32 is exposed through the through-holes 40 in which the conducing layer 33 does not exist. In the conductor opening 35b, the conductor electrode terminal 39 is exposed in rectangular shape.

Determination as to whether the semiconductor wafer 21 is in proper alignment with a contactor 30 is made in the same manner as that in the first embodiment.

In the determination, the magnitude of misalignment, if any, between the semiconductor wafer 21 and the contactor 30 can be known by placing the bump electrodes 31 of the contactor 30 in the multiple through-holes 40.

For example, if the detector electrode terminal 38 is out of contact with bump electrodes 31 in larger through-holes 40 but in contact with bump electrodes 31 in the other, smaller through-holes 40, the magnitude of the misalignment can be estimated from the size of the largest of the through-holes 40 in which the detector electrode terminal 38 contact the bump electrode 31.

Ninth Embodiment

Figure 15:
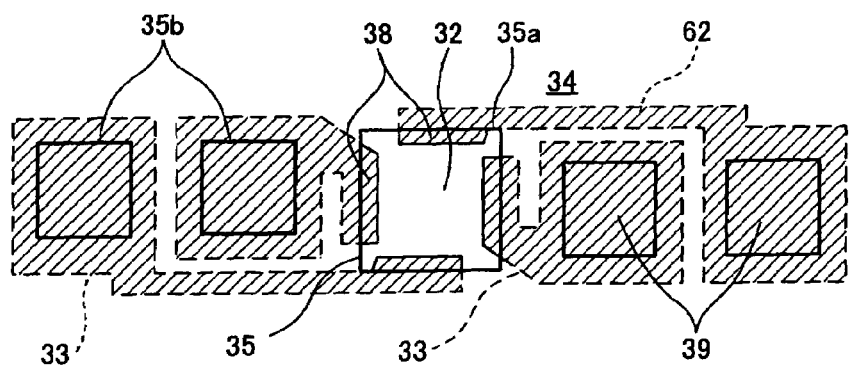
FIG. 15 is a plan view of an alignment pattern according to a ninth embodiment of the present invention.

A ninth embodiment of the present invention will be described below. FIG. 15 is a plan view of an alignment pattern 25. The alignment pattern 25 in FIG. 15 includes multiple detector electrode terminals 38 and multiple conductor electrode terminals 39 formed on an underlying insulating layer 32.

The detector electrode terminals 38 and the conductor electrode terminals 39 have their respective regions formed in a continuous conducting layer 33. An interconnection 62 formed in the conducting layer functions as a conductor connecting each conductor electrode terminal 39 with each detector electrode terminal 38. In this example, four pairs comprising a conductor electrode terminal 39 and a detector electrode terminal 38 are provided in a substantially straight line. The detector electrode terminals 38 are spatially separated from each other and the conductor electrode terminals 39 are also spatially separated from each other.

An upper insulating layer 34 provided over the underlying layer 32 and the conducting layer 33 has one rectangular detector opening 35a and multiple rectangular conductor openings 35b.

In the detector opening 35a, the detector electrode terminals 38 are exposed. Each detector electrode terminal 38 is partially exposed along each side of the inside perimeter of the detector opening 35a and the underlying insulating layer 32 is exposed in the region in the detector opening 35a where the detector electrode terminals 38 are not formed. In each of the multiple conductor openings 35b, a conductor electrode terminal 39 is exposed.

Determination as to whether or not the semiconductor wafer 21 is in proper alignment with a contactor 30 is made in the same manner as the first embodiment.

During the determination, the direction of misalignment, if any, between the semiconductor wafer 21 and the contactor 30 can also be known by placing the bump electrodes 31 of the contactor 30 in the detector and the conductor openings 35a and 35b.

For example, in the detector opening 35a, if a bump electrode 31 of the contactor 30 is in contact with a detector electrode terminal 38 in the upper part of FIG. 15, electricity is conducted between the bump electrode 31 in contact with the conductor electrode terminal 39 formed in the same conducting layer 33 in which that detector electrode terminal 38 is formed and the bump electrode 31 in contact with the detector electrode terminal 38.

Therefore, it can be determined, on the basis of a combination of conducting bump electrodes 31, which of the detector electrode terminals 38 is in contact with a bump electrode 31 placed in the detector opening 35a. From the determination, the relative direction of misalignment of the semiconductor wafer 21 with the contactor 30 can be known.

Tenth Embodiment

Figure 16:
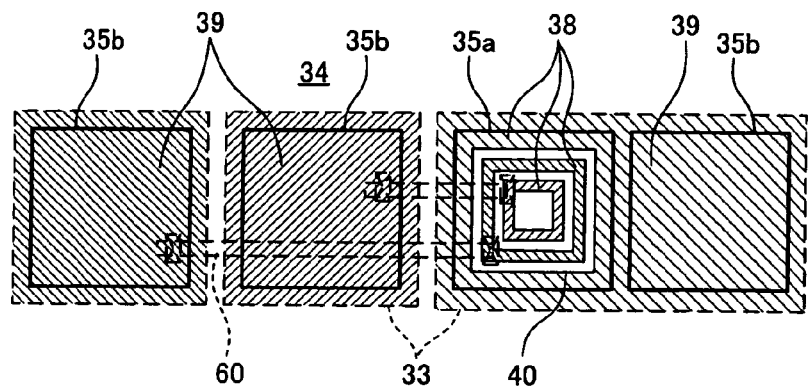
FIG. 16 is a plan view of an alignment pattern according a tenth embodiment of the present invention.

A tenth embodiment of the present invention will be described below. FIG. 16 is a plan view of an alignment pattern 25. The alignment pattern 25 in FIG. 16 includes three pairs of a detector electrode terminal 38 and a conductor electrode terminal 39 formed on an underlying insulating layer 32.

An upper insulating layer 34 provided over the underlying insulating layer 32 has one rectangular detector opening 35a and a number of conductor openings 35b.

The detector electrode terminals 38 are exposed in the detector opening 35a in the form of rings along the perimeter of the detector opening 35a. A through-hole 40 is provided in the center of the detector opening 35a and the detector electrode terminals 38 are provided coaxially and separated from each other by a gap. In the detector opening 35a, the underlying insulating layer 32 is exposed in the region where the detector electrode terminals 38 are not provided.

The pair comprising the outermost detector electrode terminal 38 and a conductor electrode terminal 39 is formed as a continuous conducting layer 33 comprising the outermost detector electrode terminal 38 and a conductor electrode terminal 39. The conductor electrode terminal 39 is exposed in rectangular shape in its corresponding conductor opening 35b.

The conductor electrode terminal 39 of each of the other two pairs is exposed in rectangular shape in the corresponding conductor opening 35b and connected to the middle or the innermost detector electrode terminal 38 through an interconnection 60 in the underlying layer as a conducting means.

Determination as to whether the semiconductor wafer 21 is in proper alignment with a contactor 30 is made in the same manner as the first embodiment.

During the determination, the magnitude of misalignment, if any, between the semiconductor wafer 21 and the contactor 30 can be known by placing bump electrodes 31 of the contactor 30 in the detector opening 35a and the conductor openings 35b.

For example, if a bump electrode 31 of the contactor 30 is in contact with the innermost detector electrode terminal 38 in the detector opening 35a, electricity flows between a bump electrode 31 in contact with the conductor electrode terminal 39 that is electrically connected to the innermost detector electrode terminal 38 and a bump electrode 31 in contact with the innermost detector electrode terminal 38.

Therefore, it can be determined on the basis of a combination of conducting bump electrodes 31 which of the detector electrode terminals 38 is in contact with a bump electrode 31 placed in the detector opening 35a. From the determination, the relative direction of misalignment of the semiconductor wafer 21 with the contactor 30 with respect to each other can be known.

Eleventh Embodiment

Figure 17:
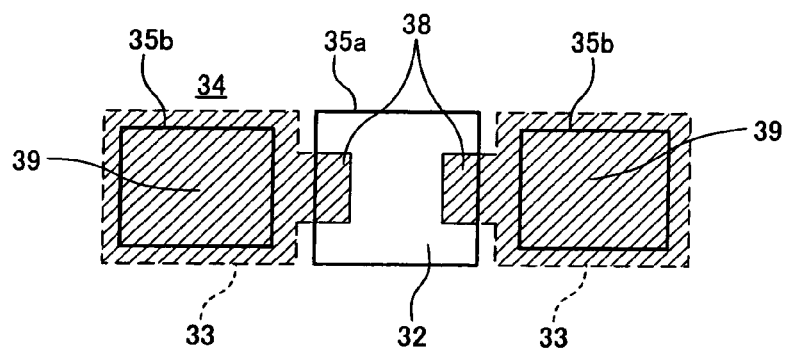
FIG. 17 is a plan view of an alignment pattern according to an eleventh embodiment of the present invention.

An eleventh embodiment of the present invention will be described below. FIG. 17 is a plan view of an alignment pattern 25. The alignment pattern 25 in FIG. 17 includes two pairs of a detector electrode terminal 38 and a conductor electrode terminal 39 formed on an underlying insulating layer 32. Each the pair of detector electrode terminals 38 and the pair of conductor electrode terminals 39 is formed by a continuous conducting layer 33.

An upper insulating layer 34 provided on the underlying insulating layer 32 has one rectangular detector opening 35a and multiple rectangular conductor openings 35b.

In the detector opening 35a, the detector electrode terminal 38 of each pair is partially exposed at opposed sides of the detector opening 35a, and the underlying insulating layer 32 is exposed in the remaining region. In each conductor opening 35b, each conductor electrode terminal 39 is exposed in rectangular shape. The two pairs of detector and conductor electrode terminals 38 and 39 are provided symmetrically.

Determination as to whether the semiconductor wafer 21 is in proper alignment with a contactor 30 is made in the same manner as in the first embodiment.

During the determination, the direction of misalignment of the semiconductor wafer 21 with the contactor 30 can be known by placing the bump electrodes 31 of the contactor 30 in the detector opening 35a and the conductor opening 35b.

For example, in the detector opening 35a, if a bump electrode 31 of the contactor 30 is in contact with a detector electrode terminal 38 in the right-hand part of FIG. 17, electricity is conducted between the bump electrode 31 in contact with the conductor electrode terminal 39 formed in the same conducting layer 33 in which the detector electrode terminal 38 is formed and the bump electrode 31 in contact with the detector electrode terminal 38.

Therefore, it can be determined on the basis of a combination of conducting bump electrodes 31 which of the detector electrode terminals 38 is in contact with a bump electrode 31 placed in the detector opening 35a. From the determination, the side-to-side misalignment of the semiconductor wafer 21 with the contactor 30 can be known.

Twelfth Embodiment

Figure 18:
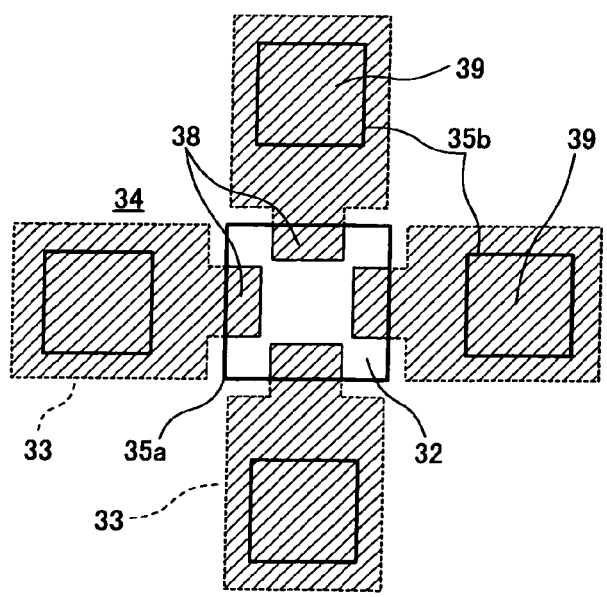
FIG. 18 is a plan view of an alignment pattern according to a twelfth embodiment of the present invention.

A twelfth embodiment of the present invention will be described below. FIG. 18 is a plan view of an alignment pattern 25. The alignment pattern 25 in FIG. 18 includes four pairs of a detector electrode terminal 38 and a conductor electrode terminal 39 formed on an underlying insulating layer 32. Each pair of the detector electrode terminal 38 and the conductor electrode terminal 39 is formed in a continuous conducting layer 33.

An upper insulating layer 34 provided over the underlying insulating layer 32 has one rectangular detector opening 35a and multiple rectangular conductor openings 35b.

In the detector opening 35a, the detector electrode terminal 38 of one pair is exposed at each of the four sides of the opening and the underlying insulating layer 32 is exposed in the region except of the detector electrode terminal 38. In each conductor opening 35b, the conductor electrode terminal 39 is exposed in rectangular shape. The four pairs of detector electrode and conductor electrode terminals 38 and 39 make the shape of a cross.

Determination as to whether the semiconductor wafer 21 is in proper alignment with a contactor 30 is made in the same way as in the first embodiment.

During the determination, the direction of misalignment of the semiconductor wafer 21 with the contactor 30 can be known by placing the bump electrodes 31 of the contactor 30 in the detector electrode opening 35a and the conductor electrode openings 35b.

For example, in the detector opening 35a, if a bump electrode 31 of the contactor 30 is in contact with a detector electrode terminal 38 at the lower part of FIG. 17, electricity is conducted between the bump electrode 31 in contact with the conductor electrode terminal 39 formed in the same conducting layer 33 in which the detector electrode terminal 38 is formed and the bump electrode 31 in contact with the detector electrode terminal 38.

Therefore, it can be determined on the basis of a combination of conducting bump electrodes 31 which of the detector electrode terminals 38 is in contact with a bump electrode 31 placed in the detector opening 35a. From the determination, the direction of horizontal and vertical misalignment of the semiconductor wafer 21 with the contactor 30 can be known.

Thirteenth Embodiment

Figure 19:
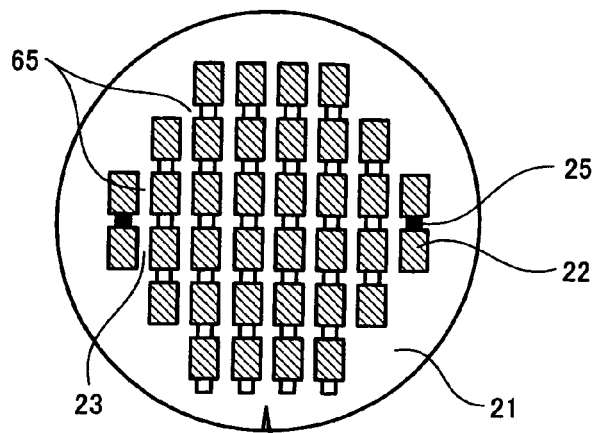
FIG. 19 is a plan view showing an arrangement of alignment patterns on a semiconductor wafer according to a thirteenth embodiment of the present invention.

A thirteenth embodiment of the present invention will be described below. FIG. 19 is a plan view showing an arrangement of alignment patterns 25 on a semiconductor wafer 21.

In FIG. 19, an alignment pattern 25 is placed in at least two locations in strait-line areas 65, other than the intersections of scribe lines 23, within the area in which semiconductor devices 22 are placed.

This arrangement of alignment patterns 25 on the semiconductor wafer 21 enables the semiconductor wafer 21 to be aligned with a contactor 30 with high accuracy.

Fourteenth Embodiment

Figure 20:
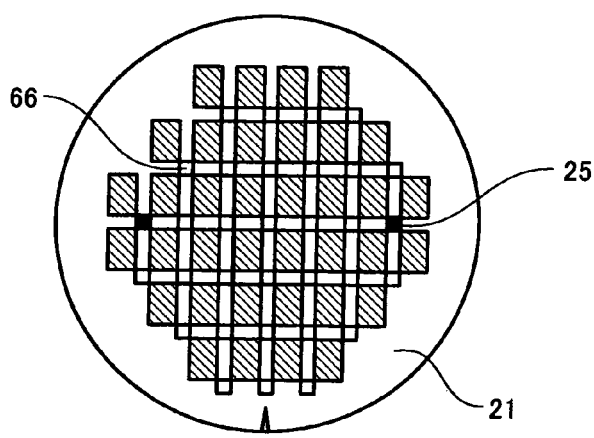
FIG. 20 is a plan view showing an arrangement of alignment patterns on a semiconductor wafer according to a fourteenth embodiment of the present invention.

A fourteenth embodiment of the present invention will be described below. FIG. 20 is a plan view showing an arrangement of alignment patterns 25 on a semiconductor wafer 21.

In FIG. 20, an alignment pattern 25 is placed in at least two intersections 66 of scribe lines 23 within a placement region of semiconductor devices 22. This arrangement of alignment patterns 25 on the semiconductor wafer 21 enables the semiconductor wafer 21 to be aligned with a contactor 30 with high accuracy.

Fifteenth Embodiment

Figure 21:
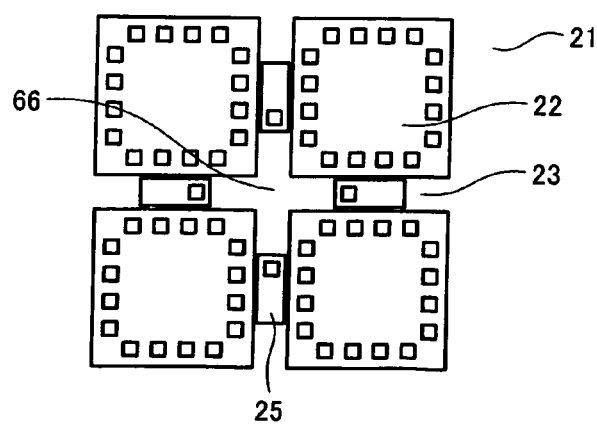
FIG. 21 is a plan view showing an arrangement of alignment patterns on a semiconductor wafer according to a fifteenth embodiment of the present invention.

A fifteenth embodiment of the present invention will be described below. FIG. 21 is a plan view showing an arrangement of alignment patterns 25 on a semiconductor wafer 21.

In FIG. 21, the alignment patterns 25 are placed in positions at a certain distance from the intersection 66 of scribe lines 23 within the placement region of semiconductor devices 22. For example, a pair of alignment patterns 25 may be placed at an angle of 180 degrees symmetrically about a certain point. Alternatively, a number of alignment patterns 25 may be provided in scribe lines 23 at intervals of 90 degrees about a certain point in the form of the character T or a cross.

Such a set of alignment patterns 25 is placed in at least two intersections of scribe lines 23.

This arrangement of such sets of alignment patterns 25 on the semiconductor wafer 21 enables the semiconductor wafer 21 to be aligned with a contactor 30 with high accuracy.

Furthermore, by using any of the various types of alignment patterns 25 described earlier with respect to the embodiments, misalignment directions and magnitudes can be determined. For example, if the alignment pattern 25 shown in FIG. 14 is provided in four directions, misalignment directions and magnitudes can be determined.

Sixteenth Embodiment

Figure 22:
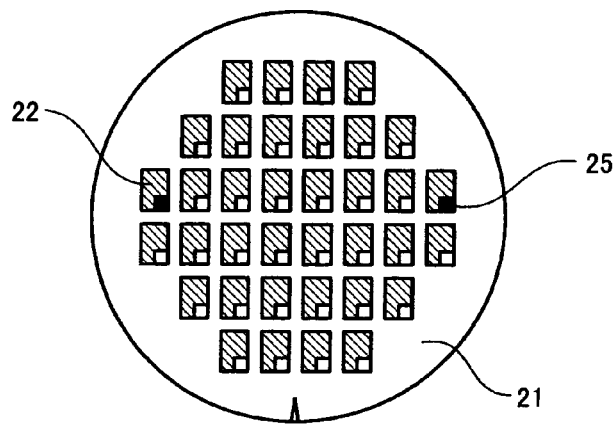
FIG. 22 is a plan view showing an arrangement of alignment patterns on a semiconductor wafer according to a sixteenth embodiment of the present invention.

A sixteenth embodiment of the present invention will be described below. FIG. 22 is a plan view showing an arrangement of alignment patterns 25 on a semiconductor wafer 21.

In FIG. 22, an alignment pattern 25 is provided in at least two semiconductor devices 22 within the placement region of semiconductor devices 22.

This arrangement of alignment patterns 25 on the semiconductor wafer 21 enables the semiconductor wafer 21 to be aligned with a contactor 30 with a high accuracy.

Seventeenth Embodiment

Figure 23:
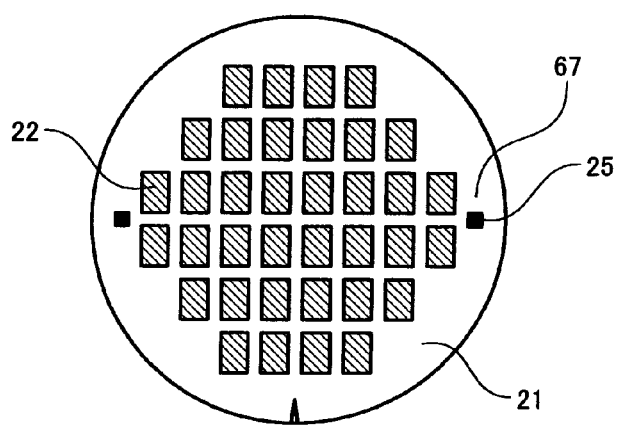
FIG. 23 is a plan view showing an arrangement of alignment patterns on a semiconductor wafer according to a seventeenth embodiment of the present invention.

A seventeenth embodiment of the present invention will be described below. FIG. 23 is a plan view showing an arrangement of alignment patterns 25 on a semiconductor wafer 21.

In FIG. 23, an alignment pattern 25 is placed in at least two locations in the peripheral edge margin 67 where no semiconductor device 22 is provided.

This arrangement of alignment patterns 25 on the semiconductor wafer 21 enables the semiconductor wafer 21 to be aligned with a contactor 30 with high accuracy.

Eighteenth Embodiment

Figure 24:
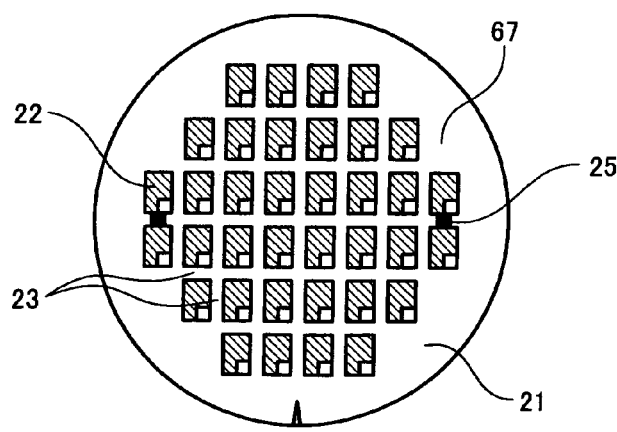
FIG. 24 is a plan view showing an arrangement of alignment patterns on a semiconductor wafer according to eighteenth embodiment of the present invention.
Figure 25:
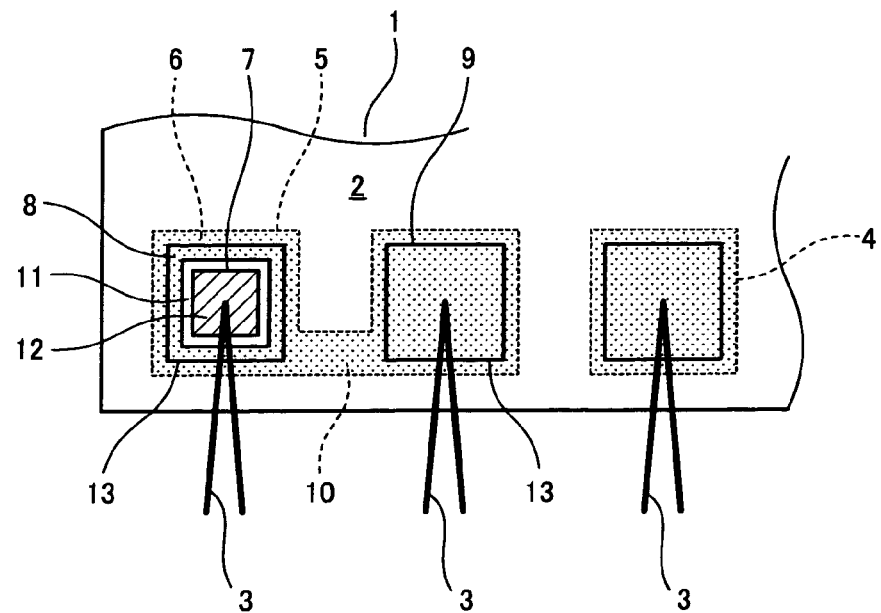
FIG. 25 is a schematic diagram showing a pattern used for alignment during testing of a semiconductor wafer according to a conventional art.
Figure 26:
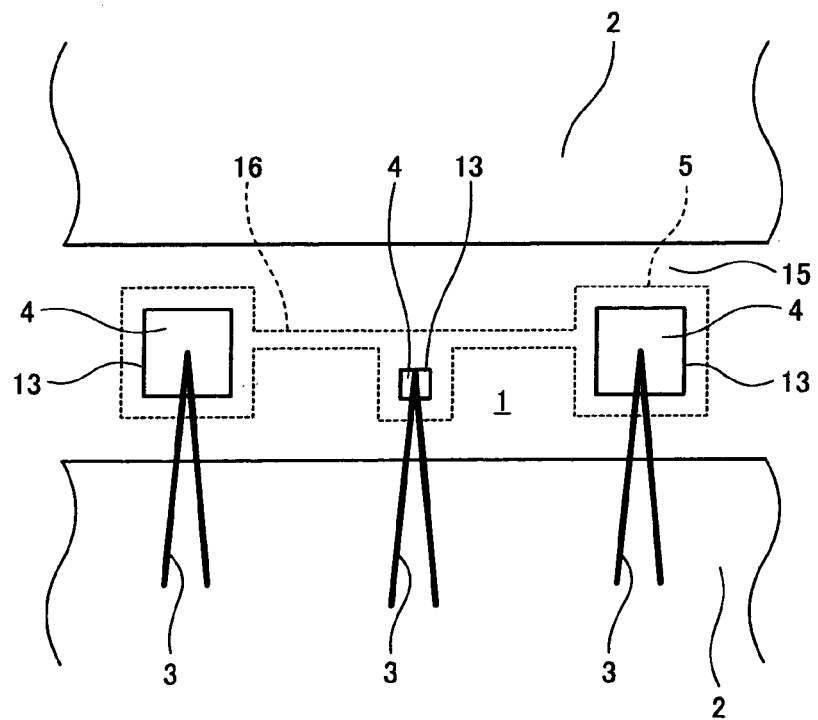
FIG. 26 is a schematic diagram showing a pattern used for alignment during testing of a semiconductor wafer according to a conventional art.

An eighteenth embodiment of the present invention will be described below. FIG. 24 is a plan view showing an arrangement of alignment patterns 25 on a semiconductor wafer 21.

In FIG. 24, an alignment pattern 25 is placed in at least two substantially opposed two locations in a straight-line area of a scribe line 23 within the semiconductor device 22 layout area. Alternatively, an alignment pattern 25 may be placed in at least two intersections 66 of scribe lines or at least two locations in the peripheral edge margin 67.

This arrangement of alignment patterns 25 on the semiconductor wafer 21 enables the semiconductor wafer 21 to be aligned with a contactor 30 with high accuracy.

Arrangements of alignment patterns 25 on a semiconductor wafer 21 and combinations thereof have been described in the description of the embodiments in which detector electrode terminals of the alignment patterns 25 are opposed to each other. However, the same effects that are provided by such arrangements can be provided by other arrangements of detector electrode terminals.

The semiconductor wafer and testing method thereof according to the present invention are effective at improving the quality and efficiency of tests of semiconductor devices formed on a semiconductor wafer.

What is claimed is:

1. A semiconductor wafer comprising a plurality of semiconductor devices and alignment patterns, wherein
    the alignment patterns comprise an underlying insulating layer, a conducting layer, and upper insulating layer on the wafer,
    the conducting layer comprises a detector electrode terminal and a conductor electrode terminal, and the detector electrode terminal and the conductor electrode terminal are electrically interconnected through a conductor,
    the upper insulating layer includes a detector opening and a conductor opening,
    the conductor electrode terminal is exposed in the conductor opening,
    the detector electrode terminal is partially exposed in the detector opening along an inside perimeter of the detector opening, and
    the underlying layer is exposed in the detector opening in a region other than a region of the detector electrode terminal.

2. The semiconductor wafer according to claim 1, wherein a through-hole in which the underlying insulating layer is exposed in the detector electrode terminal, the detector opening is around the through-hole, and the detector electrode terminal is exposed in the shape of a ring along the inside perimeter of the detector opening.

3. The semiconductor wafer according to claim 2, wherein a through-hole exists at each of a plurality of locations in the detector electrode terminal in a row at regular spacings, the through-holes proportionally varying in size.

4. The semiconductor wafer according to claim 1, wherein the detector opening is rectangular and a portion of the detector electrode terminal is exposed along one side of the inside perimeter of the detector opening.

5. The semiconductor wafer according to claim 1, wherein the conductor electrically connecting the detector electrode terminal and the conductor electrode terminal is the conducting layer.

6. The semiconductor wafer according to claim 1, wherein a contact hole is in the underlying insulating layer of the alignment patterns, an interconnection is in the contact hole, and the conductor electrically interconnecting the detector electrode terminal and the conductor electrode terminal is the interconnection.

7. The semiconductor wafer according to claim 1, wherein a pair of alignment patterns is arranged symmetrically at an angle of 180 about a certain point.

8. The semiconductor wafer according to claim 1, wherein a plurality of alignment patterns is arranged at intervals of 90 degrees about a certain point in the form of the character T or a cross.

9. The semiconductor wafer according to claim 1, wherein alignment patterns are in at least two intersections of scribe lines in the semiconductor device placement region of the semiconductor wafer.

10. The semiconductor wafer according to claim 1, wherein alignment patterns are in at least two locations in the semiconductor device placement region of the semiconductor wafer.

11. The semiconductor wafer according to claim 1, wherein alignment patterns are in at least two locations in a peripheral edge margin on the semiconductor wafer in which semiconductor devices are not located.

12. The semiconductor wafer according to claim 1, wherein alignment patterns are in at least two locations in any one of the regions from the group consisting of a semiconductor device placement region in the semiconductor wafer, straight-line areas in scribe lines, intersections of scribe lines, and a peripheral edge margin of the semiconductor device.

13. A semiconductor wafer comprising a plurality of semiconductor devices and alignment patterns, wherein
the alignment patterns comprise an underlying insulating layer, a conducting layer, and an upper insulating layer on the wafer,
the conducting layer comprises a plurality of detector electrode terminals and a plurality of conductor electrode terminals;
the detector electrode terminal and the conductor electrode terminal are electrically interconnected through a conductor,
the upper insulating layer includes one detector opening in which the plurality of detector electrode terminals are exposed together and a plurality of conductor openings in which each of the plurality of conductor electrode terminals is exposed individually,
the detector opening is rectangular,
each of the plurality of detector electrode terminals are partially exposed in the detector opening along each side of an inside perimeter of the detector opening, and
the underlying insulating layer is exposed in the detector opening in a region other than a region of the detector electrode terminal.

14. A semiconductor wafer comprising a plurality of semiconductor devices and alignment patterns, wherein
the alignment patterns comprise an underlying insulating layer, a conducting layer, and an upper insulating layer,
the conducting layer comprises a plurality of detector electrode terminals and a plurality of conductor electrode terminals,
the detector electrode terminal and the conductor electrode terminal are electrically interconnected through a conductor,
the upper insulating layer includes one detector opening in which the plurality of detector electrode terminals are exposed together and a plurality of conductor openings in which each of the plurality of conductor electrode terminals is exposed individually,
the plurality of detector electrode terminals is exposed in spaced coaxial rings in the detector opening, and
the underlying insulating layer is exposed in the detector opening in a region other than a region of the detector electrode terminal.

15. A semiconductor wafer comprising a plurality of semiconductor devices and alignment patterns, wherein
the alignment patterns comprise an underlying insulating layer, a conducting layer, and upper insulating layer on the wafer,
the conducting layer comprises a detector electrode terminal and a conductor electrode terminal,
one of the detector electrode terminal and the conductor electrode terminal is connected to a grounding conductor, and the other is connected to an input circuit conductor or in a floating state,
the upper insulating layer includes an opening, in which the detector electrode terminal is partially exposed along an inside perimeter of the opening, and is opposed to and spaced apart from the conductor electrode, and
the underlying insulating layer is exposed in the opening in a region other than regions of the conductor electrode terminal and the detector electrode terminal.

16. The semiconductor wafer according to claim 15, wherein the detector electrode terminal surrounds the conductor electrode terminal in the opening and is separated from the conductor electrode terminal by a gap.

17. The semiconductor wafer according to claim 15, wherein the conductor electrode terminal is exposed in rectangular shape in the opening, and the detector electrode terminal surrounds the conductor electrode terminal, except along one side of the conductor electrode terminal and is separated from the conductor electrode terminal by a gap.

18. The semiconductor wafer according to claim 15, wherein the opening has a rectangular shape and the detector electrode terminal is partially exposed at only one side of the opening.

* * * * *